(12) United States Patent
Malvade et al.

(10) Patent No.: US 10,823,655 B2
(45) Date of Patent: Nov. 3, 2020

(54) METHOD AND APPARATUS TO MEASURE STRAINS IN ADHESIVES OF JOINTS

(71) Applicant: DEERE & COMPANY, Moline, IL (US)

(72) Inventors: Indrajit Malvade, Pune (IN); Austin E. Vize, Dubuque, IA (US); Casey E. Gales, Dubuque, IA (US)

(73) Assignee: DEERE & COMPANY, Moline, IL (US)

(*) Notice: Subject to any disclaimer, the term of this patent is extended or adjusted under 35 U.S.C. 154(b) by 101 days.

(21) Appl. No.: 16/155,969

(22) Filed: Oct. 10, 2018

(65) Prior Publication Data

US 2020/0116609 A1 Apr. 16, 2020

(51) Int. Cl.
*G01N 3/00* (2006.01)
*G01N 3/56* (2006.01)
*G06F 30/23* (2020.01)

(52) U.S. Cl.
CPC .............. *G01N 3/56* (2013.01); *G06F 30/23* (2020.01); *G01N 2203/0073* (2013.01); *G01N 2203/0282* (2013.01); *G01N 2203/0296* (2013.01)

(58) Field of Classification Search
CPC .................................. G01N 3/56; G06F 30/23
See application file for complete search history.

(56) References Cited

U.S. PATENT DOCUMENTS

| 2,544,673 | A | | 3/1951 | Haber | |
|---|---|---|---|---|---|
| 4,944,185 | A | * | 7/1990 | Clark, Jr. | G01N 29/12 324/214 |
| 5,245,293 | A | * | 9/1993 | Runner | G01N 27/225 156/64 |
| 5,841,034 | A | * | 11/1998 | Ball | G01M 11/086 73/800 |
| 6,756,580 | B2 | * | 6/2004 | Schulz | G01M 3/165 250/227.14 |
| 8,250,928 | B2 | * | 8/2012 | Miller | B29C 65/8284 73/779 |
| 8,641,845 | B2 | * | 2/2014 | Bruck | B23K 1/19 156/272.4 |
| 8,710,834 | B2 | * | 4/2014 | May | B29C 70/025 324/228 |
| 8,812,251 | B2 | * | 8/2014 | Ihn | G01N 27/026 702/33 |
| 9,261,444 | B1 | * | 2/2016 | Sutherland | G01N 3/02 |

(Continued)

FOREIGN PATENT DOCUMENTS

EP 0336829 A1 10/1991

*Primary Examiner* — Jamel E Williams
(74) *Attorney, Agent, or Firm* — Taft Stettinius & Hollister LLP; Stephen F. Rost

(57) ABSTRACT

Joints, strain measurement systems to measure strains in one or more components of joints, and methods of determining fatigue lives of joints are disclosed herein. A joint includes a first component, a second component, an adhesive, and a strain measurement system. The adhesive couples the first component and the second component together. The strain measurement system is configured to measure strain in one or more components of the joint. The strain measurement system includes a sensor coupled to one of the first component and the second component and a controller coupled to the sensor. The controller includes a processor and memory coupled to the processor that has instructions stored therein.

20 Claims, 7 Drawing Sheets

(56) References Cited

U.S. PATENT DOCUMENTS 9,784,668 B2 * 10/2017 Hull ...................... G01N 19/04
2014/0327433 A1 * 11/2014 Anway ............... B29C 65/5021
324/239

* cited by examiner

METHOD AND APPARATUS TO MEASURE STRAINS IN ADHESIVES OF JOINTS

FIELD OF THE DISCLOSURE

The present disclosure relates, generally, to joints, and, more specifically, to joints incorporating adhesives.

BACKGROUND

In some cases, it may be desirable to measure strains in one of more portions of a joint to determine joint integrity. Measurement of strains in an adhesive of a joint, for example, may be complicated due to the type, thickness, and/or other dimensional constraints of the adhesive. Additionally, heat exposure associated with curing of an adhesive of a joint may further complicate such strain measurement. Finally, residual stresses associated with mounting one or more sensing devices to an adhesive of a joint may complicate strain measurement further still. Methods and apparatuses to measure strains in adhesives of joints that avoid the aforementioned drawbacks remain an area of interest.

SUMMARY

The present disclosure may comprise one or more of the following features and combinations thereof.

According to one aspect of the present disclosure, a joint may include a first component, a second component, an adhesive, and a strain measurement system. The adhesive may couple the first component and the second component together. The strain measurement system may be configured to measure strain in one or more components of the joint. The strain measurement system may include a sensor coupled to one of the first component and the second component and a controller coupled to the sensor. The controller may include a processor and memory coupled to the processor. The memory may have instructions stored therein that are executable by the processor to associate at least one localized strain value in the adhesive with at least one localized strain value in one of the first and second components and to determine at least one localized strain value in the adhesive based on that association.

In some embodiments, each of the first component and the second component may have a metallic construction, and the sensor of the strain measurement system may be mounted on one of the first component and the second component adjacent to the adhesive. The strain measurement system may include no more than one sensor. The adhesive may have a thickness of approximately 0.25 millimeters.

In some embodiments, to associate the at least one localized strain value in the adhesive with the at least one localized strain value in one of the first and second components, the processor may be configured to execute the instructions stored in the memory to predict one or more locations of relatively-high strain values in the adhesive. To predict the one or more locations of relatively-high strain values in the adhesive, the processor may be configured to execute the instructions stored in the memory to predict the one or more locations of relatively-high strain values in the adhesive based on a finite element analysis model. Additionally, in some embodiments, to associate the at least one localized strain value in the adhesive with the at least one localized strain value in one of the first and second components, the processor may be configured to execute the instructions stored in the memory to calculate one or more relations between the relatively-high strain values in the one or more locations of the adhesive and strain values in at least one of the first and second components in one or more locations adjacent to the one or more locations of the adhesive. The one or more relations may each include a ratio of strain in at least one location of the adhesive to strain in at least one location of the first component or the second component.

In some embodiments, the processor may be configured to execute the instructions stored in the memory to receive input provided by the sensor that is indicative of actual strain values in at least one of the first and second components in the one or more locations adjacent to the one or more locations of the adhesive. The processor may be configured to execute the instructions stored in the memory to determine the at least one localized strain value in the adhesive based on the input provided by the sensor and the one or more relations calculated by the processor. The processor may be configured to execute the instructions stored in the memory to predict fatigue life of the joint based on the at least one localized strain value in the adhesive determined by the processor.

According to another aspect of the present disclosure, a strain measurement system to measure strain in one or more components of a joint having a first component, a second component, and an adhesive that couples the first component and the second component together may include a sensor and a controller. The sensor may be configured to be mounted on one of the first component and the second component adjacent to the adhesive. The controller may be coupled to the sensor. The controller may include a processor and memory coupled to the processor. The memory may have instructions stored therein that are executable by the processor to associate at least one localized strain value in the adhesive with at least one localized strain value in one of the first and second components and to determine at least one localized strain value in the adhesive based on that association.

In some embodiments, to associate the at least one localized strain value in the adhesive with the at least one localized strain value in one of the first and second components, the processor may be configured to execute the instructions stored in the memory to predict one or more locations of relatively-high strain values in the adhesive based on a finite element analysis model. The finite element analysis model may be based on the constructions of the first component, the second component, and the adhesive, and the finite element analysis model may be based on dimensions of the joint including the thickness of the adhesive.

In some embodiments, to associate the at least one localized strain value in the adhesive with the at least one localized strain value in one of the first and second components, the processor may be configured to execute the instructions stored in the memory to calculate one or more ratios of strain in at least one location of the adhesive to strain in at least one location of the first component or the second component. The processor may be configured to execute the instructions stored in the memory to (i) receive input provided by the sensor that is indicative of actual strain values in at least one of the first and second components in one or more locations thereof and (ii) determine the at least one localized strain value in the adhesive based on the input provided by the sensor and the one or more ratios calculated by the processor.

According to yet another aspect of the present disclosure, a method of determining fatigue life of a joint including a first component, a second component, and an adhesive that couples the first component and the second component together may include associating, by a controller of a strain measurement system included in the joint, at least one localized strain value in the adhesive with at least one localized strain value in one of the first and second components, and determining, by the controller, at least one localized strain value in the adhesive based on that association.

In some embodiments, associating the at least one localized strain value in the adhesive with the at least one localized strain value in the one of the first and second components may include predicting, by the controller based on a finite element analysis model, one or more locations of relatively-high strain values in the adhesive, and calculating, by the controller based on the finite element analysis model, one or more relations between the relatively-high strain values in the one or more locations of the adhesive and strain values in at least one of the first and second components in one or more locations adjacent to the one or more locations of the adhesive. Determining the at least one localized strain value in the adhesive may include receiving, by a sensor of the strain measurement system, input that is indicative of actual strain values in at least one of the first and second components in the one or more locations adjacent to the one or more locations of the adhesive, and determining, by the controller, the at least one localized strain value in the adhesive based on the input and the one or more relations. The method may further include predicting, by the controller, fatigue life of the joint based on the at least one localized strain value in the adhesive.

These and other features of the present disclosure will become more apparent from the following description of the illustrative embodiments.

BRIEF DESCRIPTION OF THE DRAWINGS

The invention described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements.

DETAILED DESCRIPTION

Figure 1:
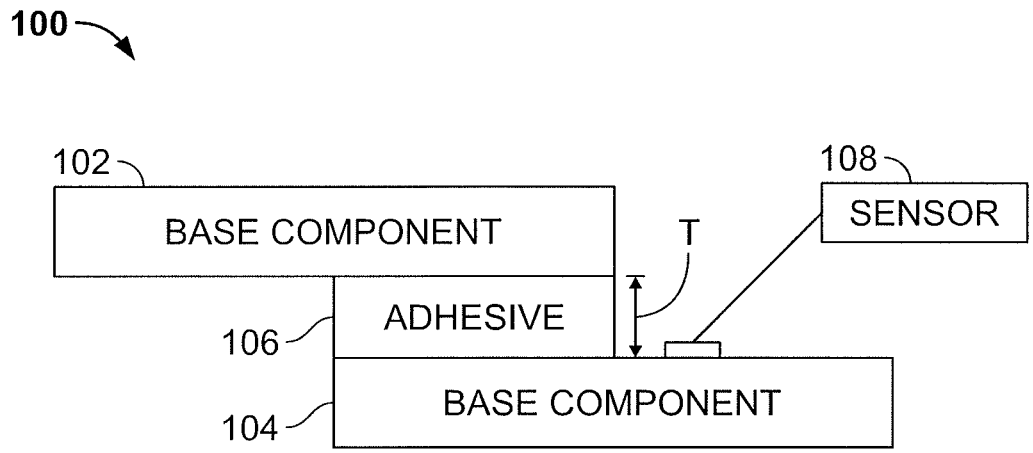
FIG. 1 is a diagrammatic view of a joint that includes a first component, a second component, an adhesive that couples the first component and the second component together, and a sensor.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

Embodiments of the invention may be implemented in hardware, firmware, software, or any combination thereof. Embodiments of the invention implemented in a computer system may include one or more bus-based interconnects or links between components and/or one or more point-to-point interconnects between components. Embodiments of the invention may also be implemented as instructions carried by or stored on a transitory or non-transitory machine-readable medium, which may be read and executed by one or more processors. A machine-readable medium may be embodied as any device, mechanism, or physical structure for storing or transmitting information in a form readable by a machine (e.g., a computing device). For example, a machine-readable medium may be embodied as read only memory (ROM); random access memory (RAM); magnetic disk storage media; optical storage media; flash memory devices; mini- or micro-SD cards, memory sticks, electrical signals, and others.

In the drawings, some structural or method features, such as those representing devices, modules, instructions blocks and data elements, may be shown in specific arrangements and/or orderings for ease of description. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

In general, schematic elements used to represent instruction blocks may be implemented using any suitable form of machine-readable instruction, such as software or firmware applications, programs, functions, modules, routines, processes, procedures, plug-ins, applets, widgets, code fragments and/or others, and that each such instruction may be implemented using any suitable programming language, library, application programming interface (API), and/or other software development tools. For example, some embodiments may be implemented using Java, C++, and/or other programming languages. Similarly, schematic elements used to represent data or information may be implemented using any suitable electronic arrangement or structure, such as a register, data store, table, record, array, index, hash, map, tree, list, graph, file (of any file type), folder, directory, database, and/or others.

Further, in the drawings, where connecting elements, such as solid or dashed lines or arrows, are used to illustrate a connection, relationship, or association between or among two or more other schematic elements, the absence of any such connection elements is not meant to imply that no connection, relationship, or association can exist. In other words, some connections, relationships, or associations between elements may not be shown in the drawings so as not to obscure the disclosure. In addition, for ease of illustration, a single connecting element may be used to represent multiple connections, relationships, or associations between elements. For example, where a connecting element represents a communication of signals, data or instructions, it should be understood by those skilled in the art that such element may represent one or multiple signal paths (e.g., a bus), as may be needed, to effect the communication.

As will be apparent from the description that follows, strains experienced by components of joints are described herein. For the purposes of the present disclosure, the terms strains and stresses may be used interchangeably.

Among other things, the present invention is directed to joints that are adapted for use in any apparatus, structure, device, or system that utilizes adhesives or other similar materials to couple components together. The joints disclosed herein may be used in, but not limited to, agriculture, lawn and garden, construction, landscaping and ground care, golf and sports turf, forestry, engine and drivetrain, and government and military applications, for example. More specifically, the joints of the present disclosure may be used in, but not limited to, tractors, front end loaders, scraper systems, cutters and shredders, hay and forage equipment, planting equipment, seeding equipment, sprayers and applicators, tillage equipment, utility vehicles, mowers, dump trucks, backhoes, track loaders, crawler loaders, dozers, excavators, motor graders, skid steers, tractor loaders, wheel loaders, rakes, aerators, skidders, bunchers, forwarders, harvesters, swing machines, knuckleboom loaders, diesel engines, axles, planetary gear drives, pump drives, transmissions, generators, and marine engines. Of course, it should be appreciated that the joints of the present disclosure may have other suitable applications.

Referring now to FIG. 1, an illustrative joint 100 is embodied as, or otherwise includes, a single lap joint. However, it should be appreciated that in other embodiments, the joint 100 may be embodied as, or otherwise include, another suitable joint. For example, the joint 100 may be embodied as, or otherwise include, a simple butt joint, a scarf joint, a T-joint, a V-joint, a tongue and groove joint, a landed scarf tongue and groove joint, a double butt lap joint, a beveled lap joint, a double lap joint, a jaggle lap joint, a single strap joint, a double strap joint, a recessed double strap joint, a beveled double strap joint, an edge joint, a corner joint, a staggered or stepped lap joint, or a tapered lap joint.

The illustrative joint 100 includes a component 102, a component 104, an adhesive 106, and a sensor 108. Each of the components 102, 104 is illustratively embodied as, and may be referred to hereinafter as, a base or primary component of the joint 100. The illustrative adhesive 106 is arranged between the base components 102, 104 such that the adhesive 106 couples the base components 102, 104 together. The illustrative sensor 108 is included in a strain measurement system 210 (see FIG. 2) of the joint 100 that, as further described below, is configured to measure strain in one or more components of the joint 100. In the illustrative embodiment, the sensor 108 is configured to be mounted on, supported by, or otherwise embedded in, one of the base components 102, 104. As such, although the sensor 108 is coupled to and mounted on the base component 104 in the illustrative embodiment, it should be appreciated that the sensor 108 may be mounted on the base component 102 in other embodiments.

Figure 2:
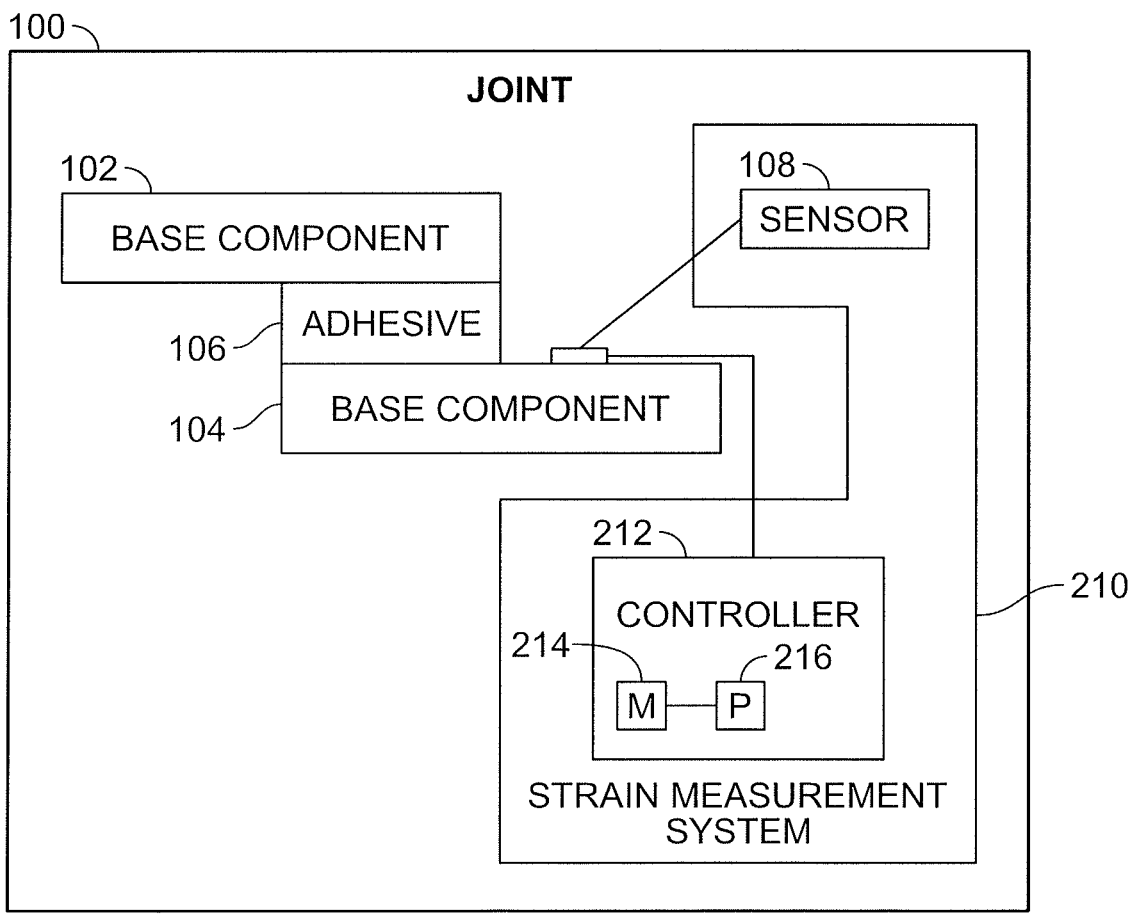
FIG. 2 a diagrammatic view of the joint of FIG. 1 showing that the joint includes a strain measurement system that has the sensor and a controller.

Referring now to FIG. 2, the illustrative strain measurement system 210 includes the sensor 108 and a controller 212 coupled to the sensor 108. The controller 212 is configured to control operation of the strain measurement system 210 and illustratively includes memory 214 and processor(s) 216 coupled to the memory 214. As described in greater detail below, the memory 214 includes instructions stored therein that are executable by the processor(s) 216 to associate at least one localized strain value in the adhesive 106 with at least one localized strain value in one of the base components 102, 104. Additionally, as further described below, the instructions stored in the memory 214 are executable by the processor(s) 216 to determine at least one localized strain in the adhesive 106 based on that association.

The controller 212 of the strain measurement system 210 illustratively makes the determination of the at least one localized strain in the adhesive 106 based on the aforementioned associated and on input provided by the sensor 108, as further explained below. That input is indicative of actual strain values in one of the base components 102, 104 (e.g., the component 102, 104 to which the sensor 108 is mounted) that are produced in response to one or more loads (e.g., external forces) applied thereto. Accordingly, in the illustrative embodiment, determination of the at least one localized strain in the adhesive 106 by the controller 212 does not rely on, or otherwise utilize, measurement of actual strains in the adhesive 106 using a sensor mounted to, or otherwise embedded in, the adhesive 106. Rather, that determination is made based on measurement of actual strains in the base component 104 using the sensor 108 which is mounted to the base component 104 adjacent to the adhesive 106. The present invention therefore is directed to apparatuses and methods for determining localized strains in the adhesive 106 while avoiding complications attendant to mounting a sensor to the adhesive 106.

In the illustrative embodiment, each of the base components 102, 104 has a metallic (i.e., steel) construction. Additionally, in the illustrative embodiment, the adhesive 106 includes, or is otherwise embodied as, a heat-cured epoxy adhesive. Of course, it should be appreciated that in other embodiments, each of the base components 102, 104 may have another suitable construction, such as a polymeric or ceramic construction, for example. Similarly, it should be appreciated that in other embodiments, the adhesive 106 may include, or otherwise be embodied as, another suitable adhesive, such as a solvent-based adhesive, an emulsion adhesive, a pressure-sensitive adhesive, a contact adhesive, a multi-component adhesive, a one-part adhesive, a natural adhesive, or a synthetic adhesive, for example.

In the illustrative embodiment, the adhesive 106 has a thickness T of approximately 0.25 millimeter. The thickness T complicates mounting of a sensor (e.g., the sensor 108) on, or embedding of a sensor in, the adhesive 106 without inducing residual stress concentrations in the adhesive 106, or without exposing the sensor to heat used to cure the adhesive 106. In some embodiments, the thickness T of the adhesive 106 may be in the range of approximately 0.1-1 millimeter.

In the illustrative embodiment, the strain measurement system 210 includes only one sensor 108. The sensor 108 is embodied as, or otherwise includes, any device capable of sensing strain experienced by the base component 104 in response to one or more loads applied thereto and providing input (e.g., electrical signals) indicative of actual, measured strain. The sensor 108 is illustratively embodied as, or otherwise includes, a strain gauge, such as a semiconductor strain gauge or piezoresistor, a foil strain gauge, a nanoparticle-based strain gauge, a microscale strain gauge, a capacitive strain gauge, or a vibrating strain gauge, or the like, for example. Of course, it should be appreciated that in other embodiments, the sensor 108 may be embodied as, or otherwise include, another suitable sensor.

In the illustrative embodiment, the memory 214 includes one or more memory devices. Each memory device 214 may be embodied as any type of volatile (e.g., dynamic random access memory (DRAM), etc.) or non-volatile memory capable of storing data therein. Volatile memory may be embodied as a storage medium that requires power to maintain the state of data stored by the medium. Non-limiting examples of volatile memory may include various types of random access memory (RAM), such as dynamic random access memory (DRAM) or static random access memory (SRAM). In some embodiments, each memory device 214 may be embodied as a block addressable memory, such as those based on NAND or NOR technologies. Each memory device 214 may also include future generation nonvolatile devices or other byte addressable write-in-place nonvolatile memory devices. Additionally, in some embodiments, each memory device 214 may be embodied, or otherwise include, a memory device that uses chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. Each memory device 214 may refer to the die itself and/or to a packaged memory product. In some embodiments still, 3D crosspoint memory may comprise a transistor-less stackable cross point architecture in which memory cells sit at the intersection of word lines and bit lines and are individually addressable and in which bit storage is based on a change in bulk resistance. In some embodiments yet still, all or a portion of each memory device 214 may be integrated into the processor(s) 216. Regardless, each memory device 214 may store various software and data used during operation such as task request data, kernel map data, telemetry data, applications, programs, libraries, and drivers.

In the illustrative embodiment, the processor(s) 216 may include one or more processors. Each processor 216 may be embodied as any type of processor or other compute circuit capable of performing various tasks such as compute functions and/or controlling the functions of the strain measurement system 210 depending on, for example, the type or intended functionality of the strain measurement system 210. In some embodiments, each processor 216 may be embodied as a single or multi-core processor, a microcontroller, or other processing/controlling circuit. Additionally, in some embodiments, each processor 216 may be embodied as, include, or be coupled to an FPGA, an application specific integrated circuit (ASIC), reconfigurable hardware or hardware circuitry, or other specialized hardware to facilitate performance of the functions described herein. In some embodiments still, each processor 216 may be embodied as a high-power processor, an accelerator co-processor, an FPGA, or a storage controller.

Figure 3:
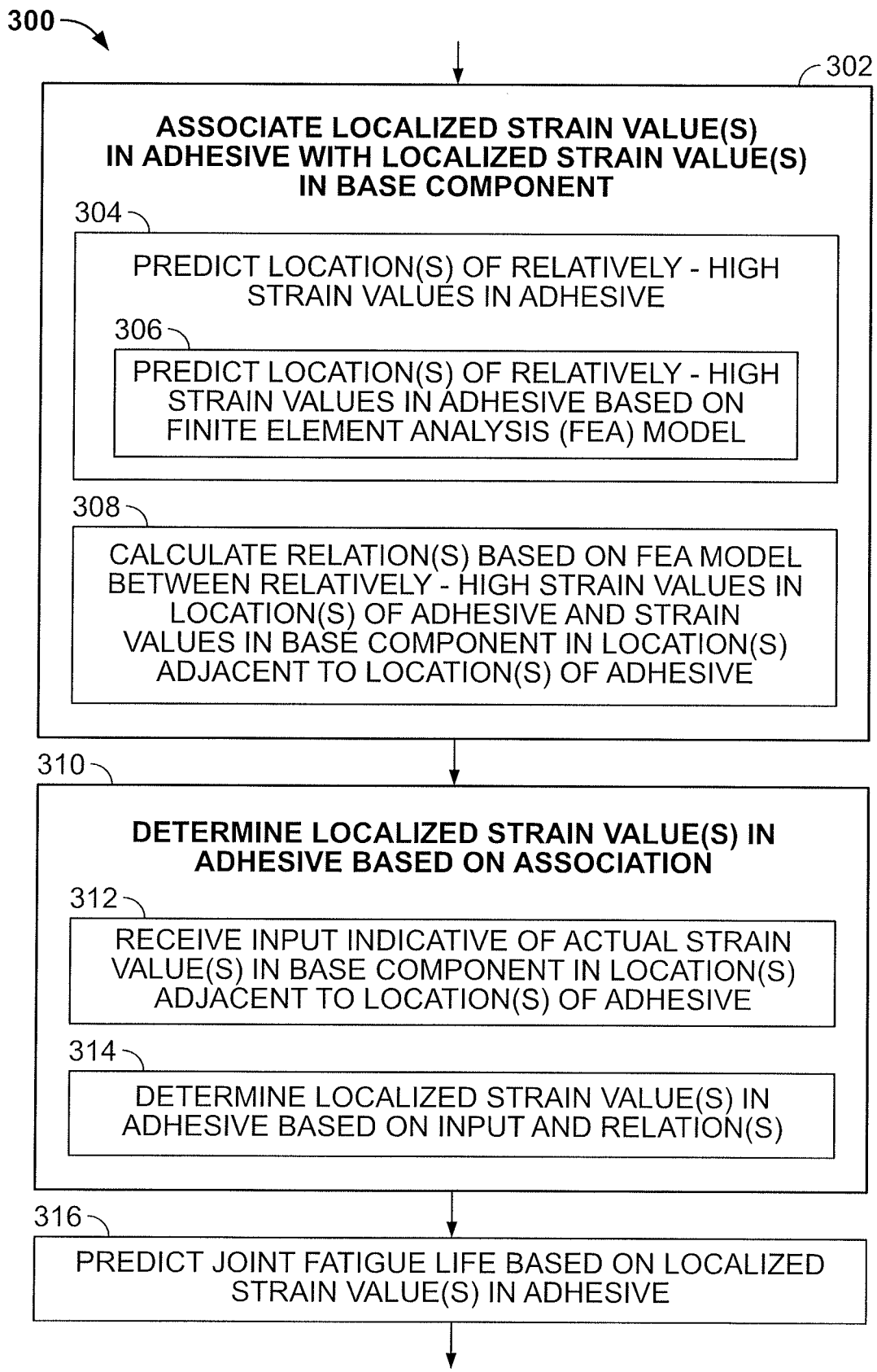
FIG. 3 is a simplified block diagram of a method that may be performed by the controller of the strain measurement system shown in FIG. 2.

Referring now to FIG. 3, in one embodiment, the controller 212 may be configured to execute a method 300 for determining fatigue life of the joint 100. It should be appreciated that the blocks of the method 300 described below may be embodied as, or otherwise included in, instructions stored in the memory 214 that are executable by the processor(s) 216. Moreover, although the method 300 is described below with regard to the illustrative FIG. 3 in which the blocks of the method 300 are shown in an illustrative format and sequence, it should be appreciated that the method 300 is not limited to the particular sequence of blocks illustrated in FIG. 3. Additionally, it should be appreciated that in other embodiments, some of the blocks of the method 300 may be performed in parallel, or otherwise contemporaneously with, other blocks and/or performed in an alternative sequence. Finally, it should be appreciated that the method 300 may incorporate blocks in addition to those illustrated in FIG. 3.

The illustrative method 300 begins with block 302 in which the controller 212 associates one or more localized strain values in the adhesive 106 with one or more localized strain values in the base component 104. To do so, the controller 212 performs blocks 304, 306, and 308, which are described below.

In block 304, the controller 212 predicts one or more locations of relatively-high strain values in the adhesive 106. To perform block 304, the controller 212 performs block 306 in which the controller 212 predicts the one or more locations of relatively-high strain values in the adhesive 106 based on a finite element analysis (FEA) model that is generated using finite element meshing techniques. In some embodiments, the FEA model may be based on, or otherwise account for, the following parameters specific to the configuration of the illustrative joint 100: the construction and material properties of each of the base components 102, 104 and the adhesive 106; the width, length, and thickness of each of the base components 102, 104 and of segments and/or portions thereof that interact with the adhesive 106; the width, length, and thickness T of the adhesive 106; the distance measured from the center of the sensor 108 to the edge of the adhesive 106 closest to the center of the sensor 108; actual loads and/or simulated loads applied to the adhesive 106 and to the base components 102, 104; mesh/element size, refinement, and/or density; and temperature of each of the base components 102, 104 and the adhesive 106 during operation of the joint 100. It should be appreciated that the aforementioned parameters may be embodied as, or otherwise include, known inputs used to create the FEA model, and that the FEA model may be based on, or otherwise account for, other and/or additional parameters to those listed above. Furthermore, it should be appreciated that the one or more locations of relatively-high strain values in the adhesive 106 may be embodied as, or otherwise include, locations in which the adhesive 106 experiences the highest strain values (i.e., according to the predictive model). In any case, subsequent to block 306, the method 300 proceeds to block 308.

In block 308, the controller 212 calculates one or more relations between the relatively-high strain values in the one or more locations of the adhesive 106 (which are predicted in block 306) and strain values in the base component 104 in one or more locations adjacent to the one or more locations of the adhesive 106. In the illustrative embodiment, each of the one or more relations includes, or is otherwise embodied as, a ratio of strain in at least one location of the adhesive 106 to strain in at least one location of the base component 104. Such ratios may be referred to hereinafter as K ratios (e.g., see FIG. 10). The calculation performed by the controller 212 in block 308 is based on the FEA model used by the controller 212 to perform block 306. Thus, the K ratios obtained in block 308 may be said to be predictive ratios. In any case, upon performing block 308, the controller 212 completes performance of block 302.

From block 302, the method 300 subsequently proceeds to block 310 in which the controller 212 determines one or more localized strain values in the adhesive 106 based on the association made in block 302. To do so, the controller 212 performs blocks 312 and 314, which are described below.

In block 312, in response to loads applied to the joint 100 prior to, or substantially contemporaneous with, performance of block 312, the controller 212 receives input indicative of actual strain values in the base component 104 in one or more locations adjacent to the one or more locations of the adhesive 106. In other words, to perform block 312, the controller 212 receives input from the sensor 108. Subsequent to block 312, the method 300 proceeds to block 314.

In block 314, the controller 212 determines one or more localized strain values in the adhesive 106 based on the input provided by the sensor 108 and the one or more relations calculated by the controller 212 (i.e., the one or more K ratios). In some embodiments, the controller 212 may multiply the one or more relations by the actual strain values associated with the input provided by the sensor 108 to determine the one or more localized strain values in the adhesive 106. Upon performing block 314, the controller 212 completes performance of block 310.

From block 310, the method 300 subsequently proceeds to block 316 in which the controller 212 predicts fatigue life of the joint 100 based on the one or more localized strain values in the adhesive 106 determined in block 310. In some embodiments, the controller 212 may predict the fatigue life of the joint 100 based on localized strain values in the adhesive 106 that are collected, accumulated, and/or aggregated over time. Based on those strain values, the controller 212 may develop and/or store (e.g., in the memory 214) a fatigue profile which may be used to predict the fatigue life of the joint 100, at least in some embodiments. The fatigue profile may represent and/or simulate a typical operational lifecycle of the joint 100, at least in some embodiments. In any case, upon performing block 316, the controller 212 completes performance of one iteration of the method 300.

Figure 4:
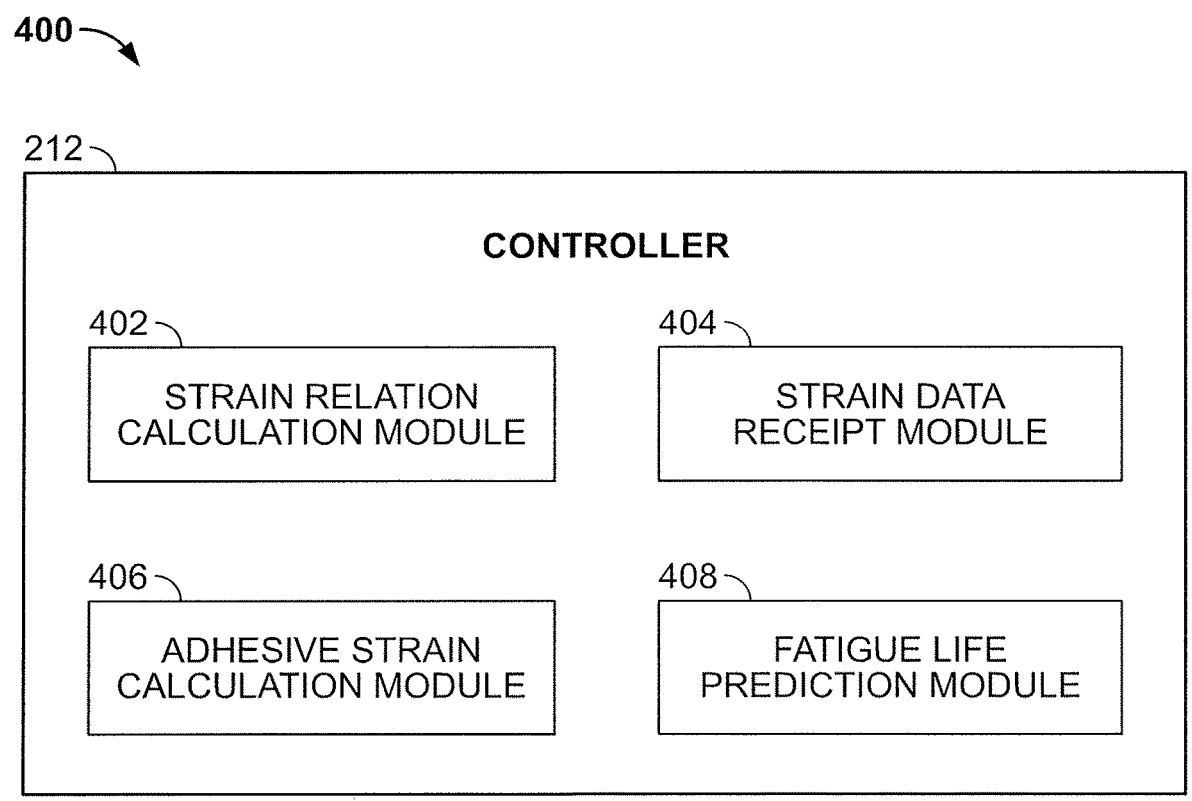
FIG. 4 is a diagrammatic view of a number of modules that may be included in the controller of the strain measurement system shown in FIG. 2.

Referring now to FIG. 4, in the illustrative embodiment, the controller 212 establishes an environment 400 during operation. The illustrative environment 400 includes a strain relation calculation module 402, a strain data receipt module 404, an adhesive strain calculation module 406, and a fatigue life prediction module 408. Each of the modules, logic, and other components of the environment 400 may be embodied as hardware, firmware, software, or a combination thereof. As such, in some embodiments, one or more modules of the environment 400 may be embodied as circuitry or a collection of electrical devices. In such embodiments, one or more of the strain relation calculation module 402, the strain data receipt module 404, the adhesive strain calculation module 406, and the fatigue life prediction module 408 may form a portion of the processor(s) 216 and/or other components of the controller 212. Additionally, in some embodiments, one or more of the illustrative modules may form a portion of another module and/or one or more of the illustrative modules may be independent of one another. Further, in some embodiments, one or more of the modules of the environment 400 may be embodied as virtualized hardware components or emulated architecture, which may be established and maintained by the processor(s) 216 or other components of the controller 212.

The strain relation calculation module 402, which may be embodied as hardware, firmware, software, virtualized hardware, emulated architecture, and/or a combination thereof as discussed above, is configured to calculate the one or more relations between the relatively-high strain values in the one or more locations of the adhesive 106 and strain values in the base component 104 in one or more locations adjacent to the one or more locations of the adhesive 106. As such, the strain relation calculation module 402 is configured to calculate the K ratios in block 308 of the illustrative method 300. In some embodiments, to calculate the K ratios, the strain relation calculation module 402 may be configured to receive and/or process data from, or otherwise associated with, the FEA model discussed above. Additionally, in some embodiments, to calculate the K ratios, the strain relation calculation module 402 may be configured to store data from, or otherwise associated with, the FEA model.

The strain data receipt module 404, which may be embodied as hardware, firmware, software, virtualized hardware, emulated architecture, and/or a combination thereof as discussed above, is configured to receive the input provided by the sensor 108 that is indicative of actual strains experienced by the base component 104 in the one or more locations adjacent to the one or more locations of the adhesive 106. Accordingly, the strain data receipt module 404 is configured to receive input from the sensor 108 in block 312 of the illustrative method 300. In some embodiments, the strain data receipt module 404 may be configured to process and/or store input provided by the sensor 108.

The adhesive strain calculation module 406, which may be embodied as hardware, firmware, software, virtualized hardware, emulated architecture, and/or a combination thereof as discussed above, is configured to determine (i.e., calculate) the one or more localized strain values in the adhesive 106 based on the input provided by the sensor 108 and the K ratios. To that end, the adhesive strain calculation module 406 may be configured to multiply the one or more strain values associated with the input provided by the sensor 108 and the K ratios in block 314 of the illustrative method 300, at least in some embodiments. Additionally, in some embodiments, the adhesive strain calculation module 406 may be configured to store the one or more localized strain values in the adhesive 106.

The fatigue life prediction module 408, which may be embodied as hardware, firmware, software, virtualized hardware, emulated architecture, and/or a combination thereof as discussed above, is configured to predict fatigue life of the joint 100 based on the one or more localized strain values in the adhesive 106. As such, the fatigue life prediction module 408 is configured to predict fatigue life of the joint 100 in block 316 of the illustrative method 300. In some embodiments, the fatigue life prediction module 408 may be configured to collect and/or store localized strain values in the adhesive 106 over time. In those embodiments, the fatigue life prediction module 408 may be configured to develop and/or store one or more fatigue profiles that may be used to predict the fatigue life of the joint 100.

Referring now to FIGS. 5-9, a number of joints are depicted that are similar to the illustrative joint 100. It should be appreciated that each of the joints depicted in those Figures may include a strain measurement system that is substantially identical to the strain measurement system 210. For the sake of simplicity, strain measurement systems are not depicted in the Figures, and detailed discussion of those systems is omitted. Nevertheless, it should be appreciated that a controller of each strain measurement system, which is substantially identical to the controller 212, is configured to execute a method substantially identical to the method 300 for determining fatigue life of the corresponding joint shown in FIGS. 5-9. Thus, the concepts described above with reference to the illustrative joint 100 are substantially applicable to the joints described below.

Figure 5:
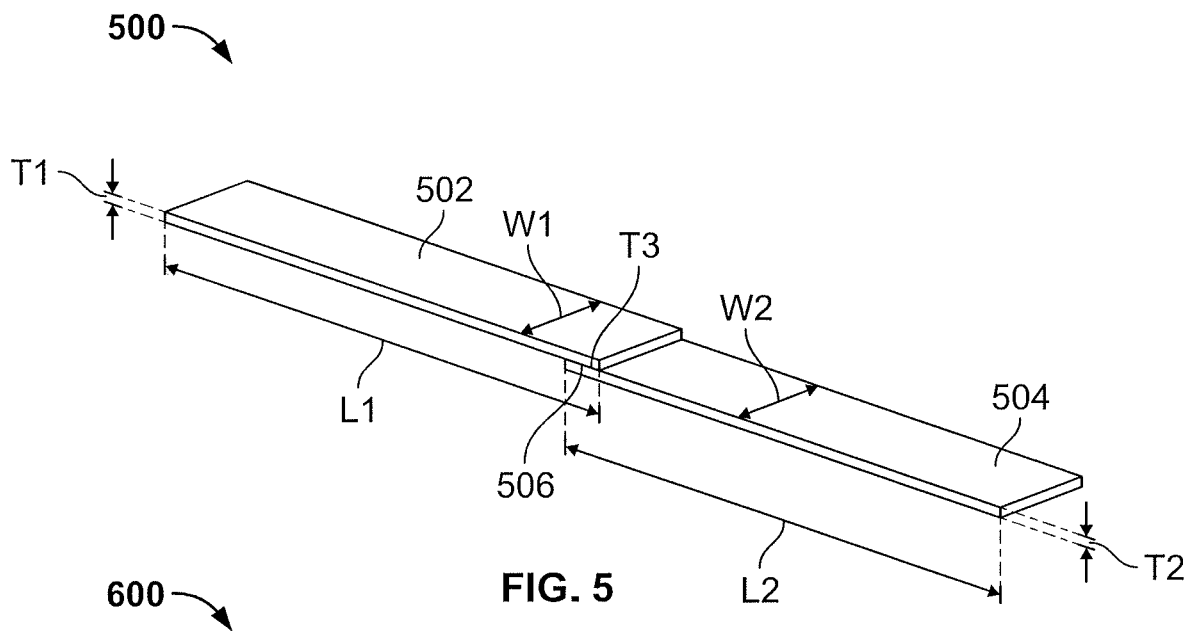
FIG. 5 is a perspective view of one embodiment of a joint similar to the joint diagrammatically depicted in FIG. 1.

Referring now to FIG. 5, an illustrative joint 500 is embodied as, or otherwise includes, a single lap joint. The joint 500 illustratively includes a base component 502, a base component 504, and an adhesive 506. In some embodiments, the base components 502, 504 and the adhesive 506 may be substantially identical, respectively, to the base components 102, 104 and the adhesive 106 of the illustrative joint 100. In any case, the illustrative adhesive 506 is arranged between the base components 502, 504 such that the adhesive 506 couples the base components 502, 504 together.

The illustrative base components 502, 504 have respective lengths L1, L2 and respective widths W1, W2. The base components 502, 504 also have respective thicknesses T1, T2. The illustrative adhesive 506 has a thickness T3.

Figure 6:
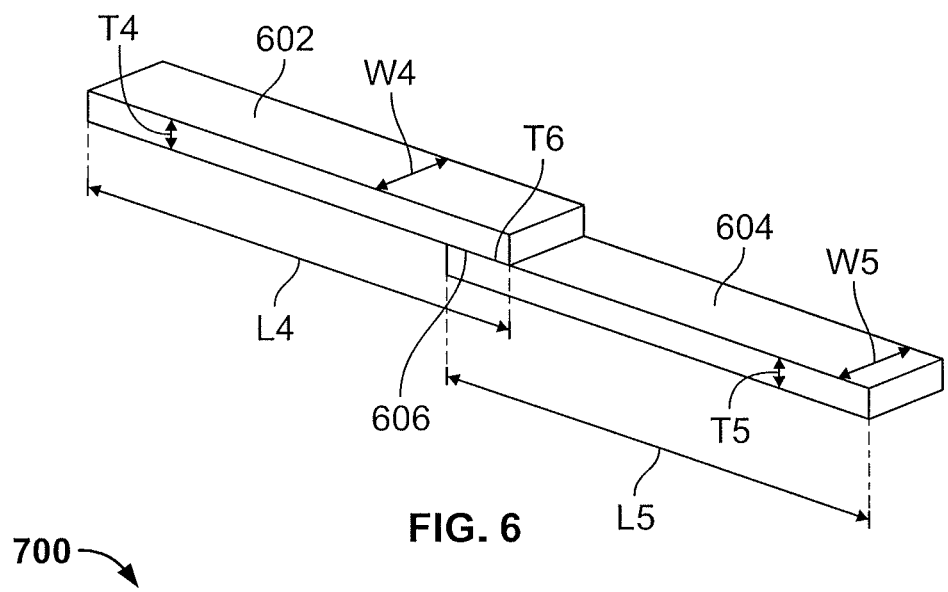
FIG. 6 is a perspective view of another embodiment of a joint similar to the joint diagrammatically depicted in FIG. 1.

Referring now to FIG. 6, an illustrative joint 600 is embodied as, or otherwise includes, a single lap joint. The joint 600 illustratively includes a base component 602, a base component 604, and an adhesive 606. In some embodiments, the base components 602, 604 and the adhesive 606 may be substantially identical, respectively, to the base components 102, 104 and the adhesive 106 of the illustrative joint 100. In any case, the illustrative adhesive 606 is arranged between the base components 602, 604 such that the adhesive 606 couples the base components 602, 604 together.

The illustrative base components 602, 604, have respective lengths L4, L5 and respective widths W4, W5. The base components 602, 604 also have respective thicknesses T4, T5. The illustrative adhesive 606 has a thickness T6. In some embodiments, the thicknesses T4, T5 of the respective base components 602, 604 may be greater than the thicknesses T1, T2 of the respective base components 502, 504.

Figure 7:
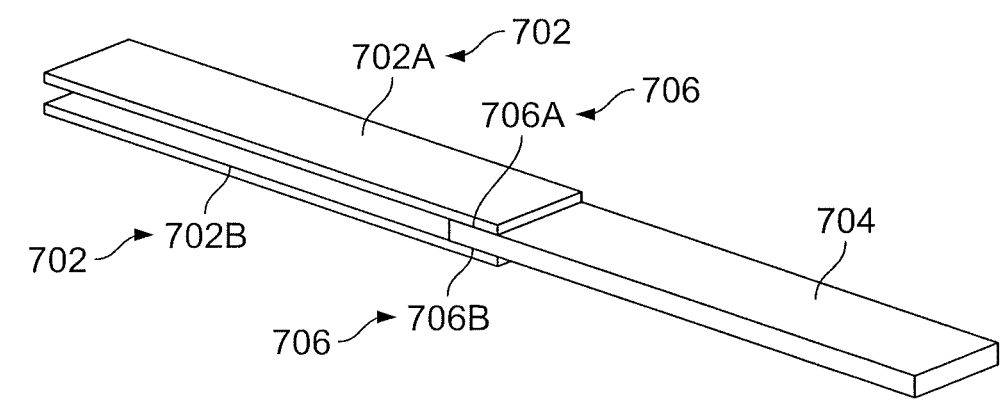
FIG. 7 is a perspective view of yet another embodiment of a joint similar to the joint diagrammatically depicted in FIG. 1.

Referring now to FIG. 7, an illustrative joint 700 is embodied as, or otherwise includes, a double lap joint. The joint 700 includes a base component 702, a base component 704, and an adhesive 706. The base component 702 includes portions 702A, 702B, and the adhesive 706 includes portions 706A, 706B. In some embodiments, the base components 702, 704 and the adhesive 706 may be similar, respectively, to the base components 102, 104 and the adhesive 106 of the illustrative joint 100. In any case, the illustrative portion 706A of the adhesive 706 is arranged between the portion 702A of the base component 702 and the base component 704 such that the adhesive portion 706A couples the base component portion 702A and the base component 704 together. The illustrative portion 706B of the adhesive 706 is arranged between the portion 702B of the base component 702 and the base component 704 such that the adhesive portion 706B couples the base component 704 and the base component portions 702B together.

Figure 8:
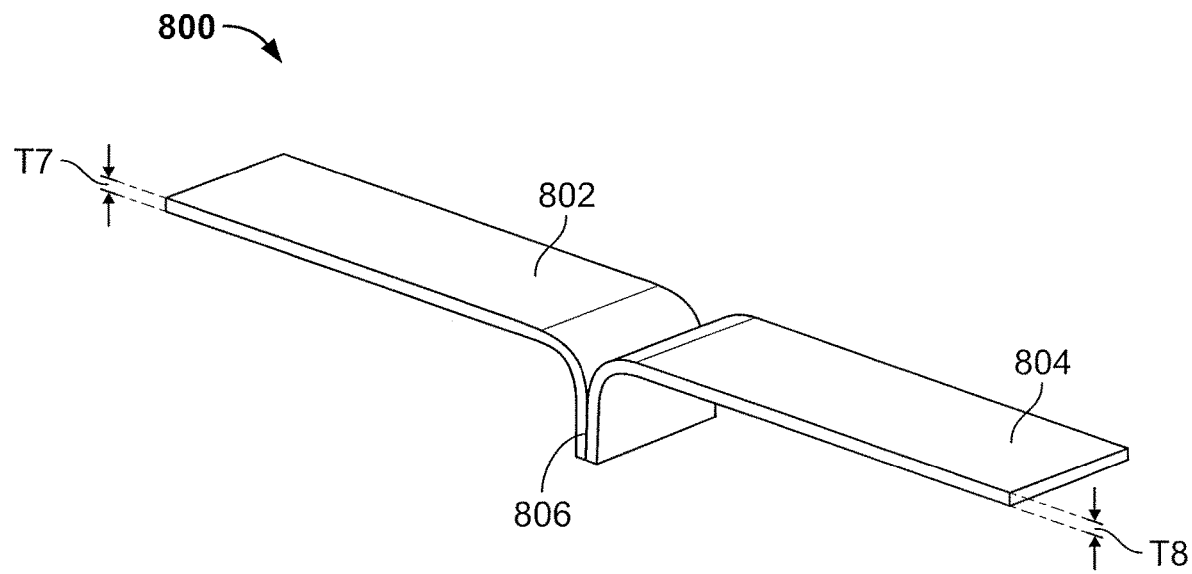
FIG. 8 is a perspective view of yet another embodiment still of a joint similar to the joint diagrammatically depicted in FIG. 1.

Referring now to FIG. 8, an illustrative joint 800 is embodied as, or otherwise includes, a T-joint. The joint 800 includes a base component 802, a base component 804, and an adhesive 806. In some embodiments, the base components 802, 804 and the adhesive 806 may be similar, respectively, to the base components 102, 104 and the adhesive 106 of the illustrative joint 100. In any case, the illustrative adhesive 806 is arranged between the base components 802, 804 such that the adhesive 806 couples the base components 802, 804 together. The base components 802, 804 have respective thicknesses T7, T8.

Figure 9:
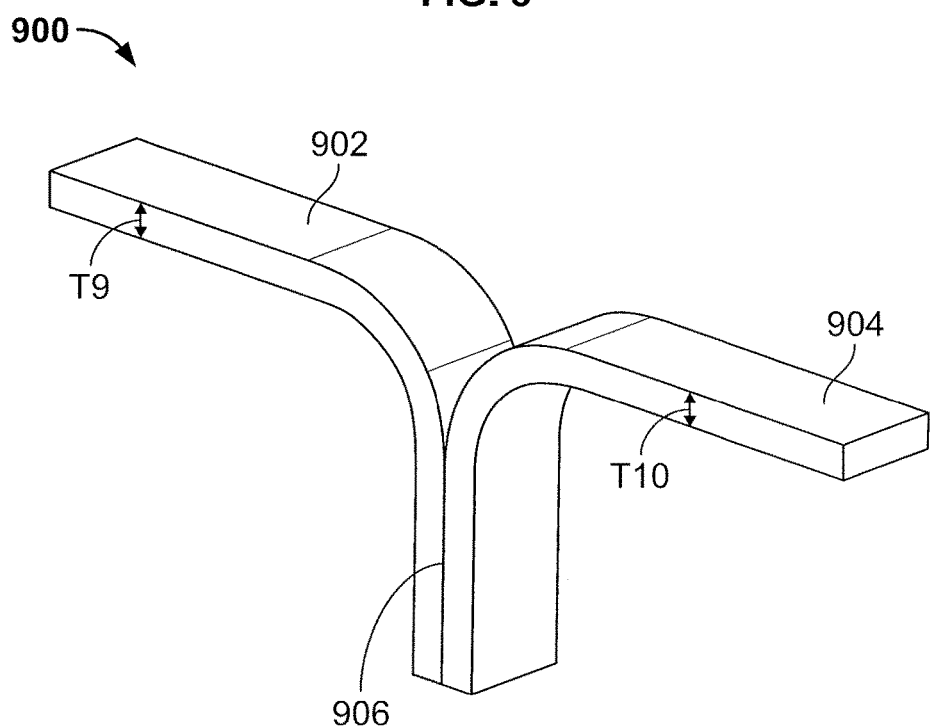
FIG. 9 is a perspective view of an additional embodiment of a joint similar to the joint diagrammatically depicted in FIG. 1.

Referring now to FIG. 9, an illustrative joint 900 is embodied as, or otherwise includes, a T-joint. The joint 900 includes a base component 902, a base component 904, and an adhesive 906. In some embodiments, the base components 902, 904 and the adhesive 906 may be similar, respectively, to the base components 102, 104 and the adhesive 106 of the illustrative joint 100. In any case, the illustrative adhesive 906 is arranged between the base components 902, 904 such that the adhesive 906 couples the base components 902, 904 together. The base components 902, 904 have respective thicknesses T9, T10. In some embodiments, the thicknesses T9, T10 of the respective base components 902, 904 may be greater than the thicknesses T7, T8 of the respective base components 802, 804.

Figure 10:
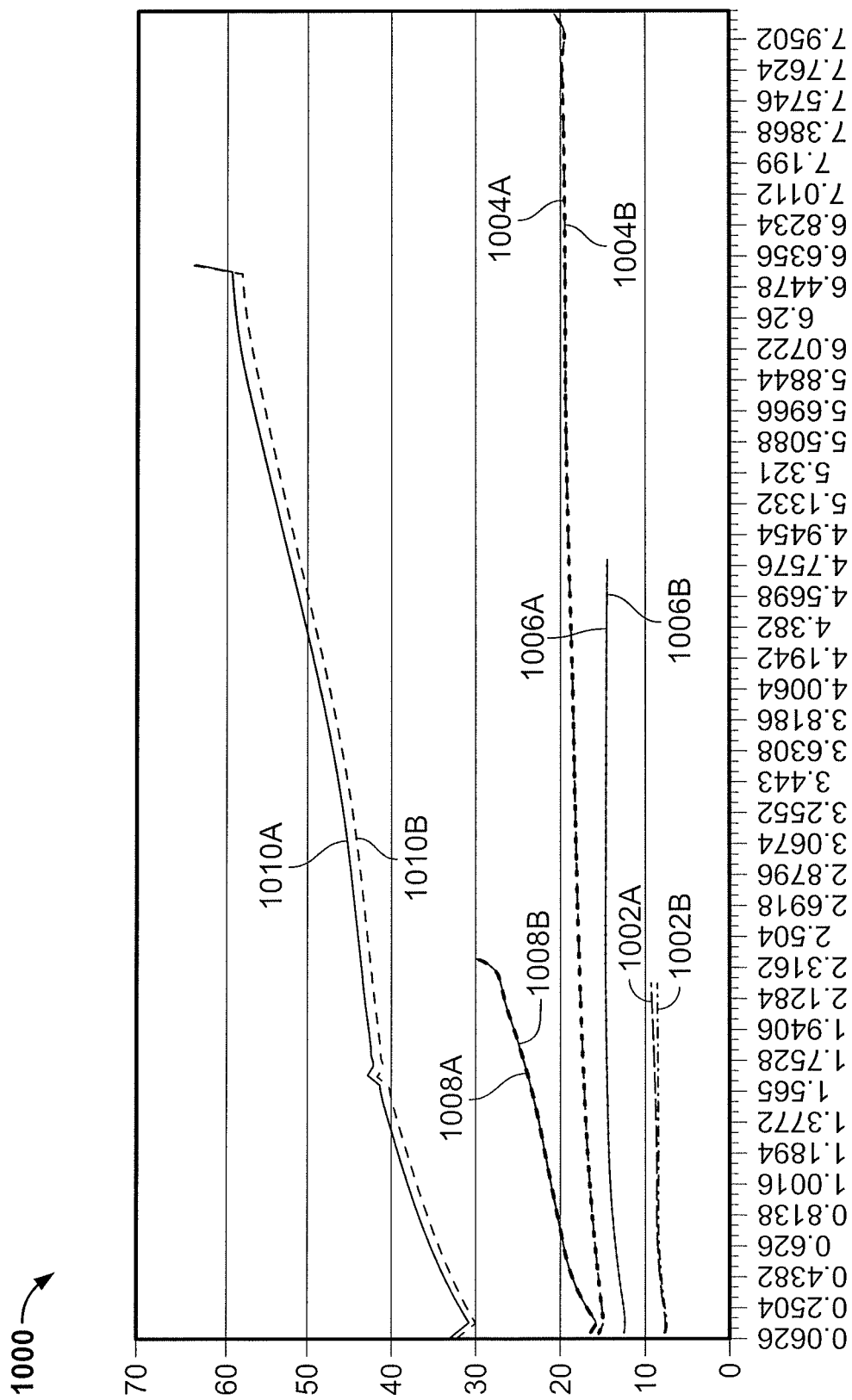
FIG. 10 is a graphical depiction of ratios of strains in the adhesive of the joint to strains in another component of the joint for the joints shown in FIGS. 5-9.

Referring now to FIG. 10, a graph 1000 illustratively depicts ratios of strain in the adhesives 506, 606, 706, 806, 906 to strain in at least one of the corresponding base components (i) 502, 504, (ii) 602, 604, (iii) 702, 704, (iv) 802, 804, and (v) 902, 904 for each one of the joints 500, 600, 700, 800, 900. That is, the graph 1000 depicts K ratios, which may be calculated for a particular joint according to the illustrative method 300 (e.g., block 308 of the method 300), for each one of the joints 500, 600, 700, 800, 900 as a function of distance between at least one of the base components 502, 504, 602, 604, 702, 704, 802, 804, 902, 904 and the corresponding adhesive 506, 606, 706, 806, 906. For each joint 500, 600, 700, 800, 900, K ratios are shown as a function of the aforementioned distance for each of two different loads applied to the joints 500, 600, 700, 800, 900. The loads applied to the joints 500, 600, 700, 800, 900 may be actual loads or loads simulated by an FEA model, at least in some embodiments. Additionally, in some embodiments, the distance may be measured from a center of each of the adhesives 506, 606, 706, 806, 906 to an edge of at least one of the corresponding base components 502, 504, 602, 604, 702, 704, 802, 804, 902, 904.

Illustrative lines 1002A, 1002B show K ratios for the joint 500 as a function of a distance between the adhesive 506 and at least one of the base components 502, 504 for the two different loads mentioned above. As can be seen from FIG.

10, the K ratios associated with the line 1002A and the first load, over the range of applicable distances, are generally equal to the K ratios associated with the line 1002B and the second load. Accordingly, the K ratios associated with the lines 1002A, 1002B do not appreciably differ from one another based on the two different loads over the range of applicable distances. Put another way, the K ratios graphically depicted for the joint 500 over the range of applicable distances are relatively constant regardless of the different loads on the joint 500.

Illustrative lines 1004A, 1004B show K ratios for the joint 600 as a function of a distance between the adhesive 606 and at least one of the base components 602, 604 for the two different loads mentioned above. As can be seen from FIG. 10, the K ratios associated with the line 1004A and the first load, over the range of applicable distances, are generally equal to the K ratios associated with the line 1004B and the second load. Accordingly, the K ratios associated with the lines 1004A, 1004B do not appreciably differ from one another based on the two different loads over the range of applicable distances. Put another way, the K ratios graphically depicted for the joint 600 over the range of applicable distances are relatively constant regardless of the different loads on the joint 600.

Illustrative lines 1006A, 1006B show K ratios for the joint 700 as a function of a distance between the adhesive 706 and at least one of the base components 702, 704 for the two different loads mentioned above. As can be seen from FIG. 10, the K ratios associated with the line 1006A and the first load, over the range of applicable distances, are generally equal to the K ratios associated with the line 1006B and the second load. Accordingly, the K ratios associated with the lines 1006A, 1006B do not appreciably differ from one another based on the two different loads over the range of applicable distances. Put another way, the K ratios graphically depicted for the joint 700 over the range of applicable distances are relatively constant regardless of the different loads on the joint 700.

Illustrative lines 1008A, 1008B show K ratios for the joint 800 as a function of a distance between the adhesive 806 and at least one of the base components 802, 804 for the two different loads mentioned above. As can be seen from FIG. 10, the K ratios associated with the line 1008A and the first load, over the range of applicable distances, are generally equal to the K ratios associated with the line 1008B and the second load. Accordingly, the K ratios associated with the lines 1008A, 1008B do not appreciably differ from one another based on the two different loads over the range of applicable distances. Put another way, the K ratios graphically depicted for the joint 800 over the range of applicable distances are relatively constant regardless of the different loads on the joint 800.

Illustrative lines 1010A, 1010B show K ratios for the joint 900 as a function of a distance between the adhesive 906 and at least one of the base components 902, 904 for the two different loads mentioned above. As can be seen from FIG. 10, the K ratios associated with the line 1010A and the first load, over the range of applicable distances, are generally equal to the K ratios associated with the line 1010B and the second load. Accordingly, the K ratios associated with the lines 1010A, 1010B do not appreciably differ from one another based on the two different loads over the range of applicable distances. Put another way, the K ratios graphically depicted for the joint 900 over the range of applicable distances are relatively constant regardless of the different loads on the joint 900.

Figure 11:
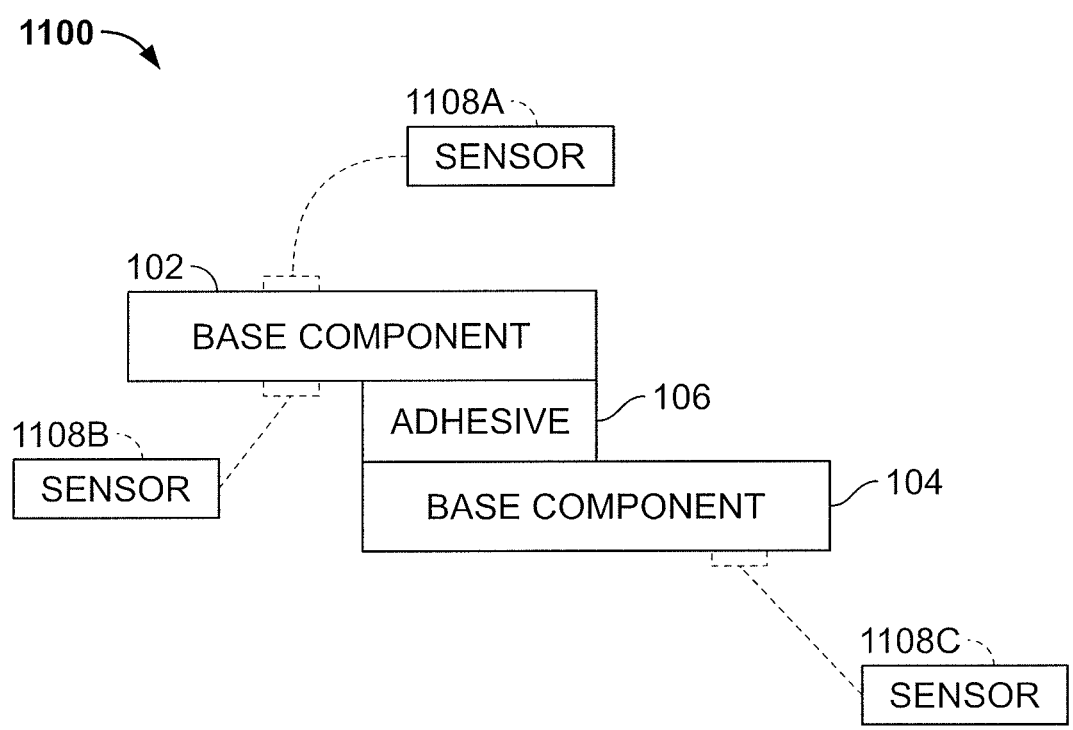
FIG. 11 is a diagrammatic view of a joint similar to the joint of FIG. 1 showing a number of different mounting locations of a sensor of the joint.

Referring now to FIG. 11, an illustrative joint 1100 includes the base components 102, 104, the adhesive 106, and a sensor 1108 mounted in one of the locations 1108A, 1108B, 1108C shown in phantom. It should be appreciated that the joint 1100 is substantially similar to the joint 100, and that any of the joints 500, 600, 700, 800, 900 may include a sensor mounted in a location similar to one of the locations 1108A, 1108B, 1108C or to the mounting location of the sensor 108. Furthermore, it should be appreciated that regardless of the mounting location 1108A, 1108B, 1108C, a controller (e.g., the controller 212) is configured to execute the method 300 to determine the fatigue life of the illustrative joint 1100.

The present disclosure is directed to, among other things, determining fatigue life of the illustrative joints 100, 500, 600, 700, 800, 900 using only one sensor (e.g., the sensor 108 or the sensor 1108). As evidenced by the illustrative method 300, that determination is made without a comparison to a reference and/or predetermined fatigue life value. In the illustrative embodiment, the invention of the present disclosure does not utilize joint-specific, localized force energizers, or other similar devices. As such, at least in some situations, the invention may not be adapted for use in servicing, inspection, maintenance, and/or in-situ monitoring applications. Of course, it should be appreciated that the teachings of the present disclosure may be applied in other applications to obtain, assess, and/or evaluate other suitable characteristics of joints.

While the disclosure has been illustrated and described in detail in the foregoing drawings and description, the same is to be considered as exemplary and not restrictive in character, it being understood that only illustrative embodiments thereof have been shown and described and that all changes and modifications that come within the spirit of the disclosure are desired to be protected.

The invention claimed is:

1. A joint comprising:
   a first component;
   a second component;
   an adhesive that couples the first component and the second component together; and
   a strain measurement system configured to measure strain in one or more components of the joint, wherein the strain measurement system includes a sensor coupled to one of the first component and the second component and a controller coupled to the sensor, wherein the controller includes a processor and memory coupled to the processor, and wherein the memory has instructions stored therein that are executable by the processor to associate at least one localized strain value in the adhesive with at least one localized strain value in one of the first and second components and to determine at least one localized strain value in the adhesive based on that association.

2. The joint of claim 1, wherein each of the first component and the second component has a metallic construction, and wherein the sensor of the strain measurement system is mounted on one of the first component and the second component adjacent to the adhesive.

3. The joint of claim 2, wherein the strain measurement system includes no more than one sensor.

4. The joint of claim 2, wherein the adhesive has a thickness of approximately 0.25 millimeters.

5. The joint of claim 1, wherein to associate the at least one localized strain value in the adhesive with the at least one localized strain value in one of the first and second components, the processor is configured to execute the instructions stored in the memory to predict one or more locations of relatively-high strain values in the adhesive.

6. The joint of claim 5, wherein to predict the one or more locations of relatively-high strain values in the adhesive, the processor is configured to execute the instructions stored in the memory to predict the one or more locations of relatively-high strain values in the adhesive based on a finite element analysis model.

7. The joint of claim 5, wherein to associate the at least one localized strain value in the adhesive with the at least one localized strain value in one of the first and second components, the processor is configured to execute the instructions stored in the memory to calculate one or more relations between the relatively-high strain values in the one or more locations of the adhesive and strain values in at least one of the first and second components in one or more locations adjacent to the one or more locations of the adhesive.

8. The joint of claim 7, wherein the one or more relations each include a ratio of strain in at least one location of the adhesive to strain in at least one location of the first component or the second component.

9. The joint of claim 7, wherein the processor is configured to execute the instructions stored in the memory to receive input provided by the sensor that is indicative of actual strain values in at least one of the first and second components in the one or more locations adjacent to the one or more locations of the adhesive.

10. The joint of claim 9, wherein the processor is configured to execute the instructions stored in the memory to determine the at least one localized strain value in the adhesive based on the input provided by the sensor and the one or more relations calculated by the processor.

11. The joint of claim 10, wherein the processor is configured to execute the instructions stored in the memory to predict fatigue life of the joint based on the at least one localized strain value in the adhesive determined by the processor.

12. A strain measurement system to measure strain in one or more components of a joint having a first component, a second component, and an adhesive that couples the first component and the second component together, the strain measurement system comprising:
a sensor configured to be mounted on one of the first component and the second component adjacent to the adhesive; and
a controller coupled to the sensor, wherein the controller includes a processor and memory coupled to the processor, and wherein the memory has instructions stored therein that are executable by the processor to associate at least one localized strain value in the adhesive with at least one localized strain value in one of the first and second components and to determine at least one localized strain value in the adhesive based on that association.

13. The strain measurement system of claim 12, wherein to associate the at least one localized strain value in the adhesive with the at least one localized strain value in one of the first and second components, the processor is configured to execute the instructions stored in the memory to predict one or more locations of relatively-high strain values in the adhesive based on a finite element analysis model.

14. The strain measurement system of claim 13, wherein the finite element analysis model is based on the constructions of the first component, the second component, and the adhesive, and wherein the finite element analysis model is based on dimensions of the joint including the thickness of the adhesive.

15. The strain measurement system of claim 13, wherein to associate the at least one localized strain value in the adhesive with the at least one localized strain value in one of the first and second components, the processor is configured to execute the instructions stored in the memory to calculate one or more ratios of strain in at least one location of the adhesive to strain in at least one location of the first component or the second component.

16. The strain measurement system of claim 15, wherein the processor is configured to execute the instructions stored in the memory to (i) receive input provided by the sensor that is indicative of actual strain values in at least one of the first and second components in one or more locations thereof and (ii) determine the at least one localized strain value in the adhesive based on the input provided by the sensor and the one or more ratios calculated by the processor.

17. A method of determining fatigue life of a joint including a first component, a second component, and an adhesive that couples the first component and the second component together, the method comprising:
associating, by a controller of a strain measurement system included in the joint, at least one localized strain value in the adhesive with at least one localized strain value in one of the first and second components; and
determining, by the controller, at least one localized strain value in the adhesive based on that association.

18. The method of claim 17, wherein associating the at least one localized strain value in the adhesive with the at least one localized strain value in the one of the first and second components includes (i) predicting, by the controller based on a finite element analysis model, one or more locations of relatively-high strain values in the adhesive and (ii) calculating, by the controller based on the finite element analysis model, one or more relations between the relatively-high strain values in the one or more locations of the adhesive and strain values in at least one of the first and second components in one or more locations adjacent to the one or more locations of the adhesive.

19. The method of claim 18, wherein determining the at least one localized strain value in the adhesive includes (i) receiving, by a sensor of the strain measurement system, input that is indicative of actual strain values in at least one of the first and second components in the one or more locations adjacent to the one or more locations of the adhesive and (ii) determining, by the controller, the at least one localized strain value in the adhesive based on the input and the one or more relations.

20. The method of claim 19, further comprising predicting, by the controller, fatigue life of the joint based on the at least one localized strain value in the adhesive.

* * * * *